(12) United States Patent
Schneider et al.

(10) Patent No.: US 7,157,923 B2
(45) Date of Patent: Jan. 2, 2007

(54) METHOD FOR FULL WAFER CONTACT PROBING, WAFER DESIGN AND PROBE CARD DEVICE WITH REDUCED PROBE CONTACTS

(75) Inventors: Peter Schneider, Williston, VT (US); Klaus Nierle, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 10/990,420

(22) Filed: Nov. 18, 2004

(65) Prior Publication Data

US 2006/0103401 A1    May 18, 2006

(51) Int. Cl.
*G01R 31/02* (2006.01)

(52) U.S. Cl. ..................... 324/754; 324/765
(58) Field of Classification Search ............. 324/765, 324/158.1, 754–763; 438/14–17; 439/482, 439/824
See application file for complete search history.

(56) References Cited

U.S. PATENT DOCUMENTS

| | | | |
|---|---|---|---|
| 4,931,053 A * | 6/1990 | L'Esperance, Jr. ............ 606/2 |
| 4,937,203 A * | 6/1990 | Eichelberger et al. ......... 438/15 |
| 4,968,931 A * | 11/1990 | Littlebury et al. ........... 324/760 |
| 5,410,259 A * | 4/1995 | Fujihara et al. ............. 324/758 |
| 5,504,369 A | 4/1996 | Dasse et al. |
| 6,121,065 A | 9/2000 | Wong et al. |
| 6,265,888 B1 * | 7/2001 | Hsu ........................... 324/760 |
| 6,534,785 B1 | 3/2003 | Farnworth et al. |
| 6,762,611 B1 | 7/2004 | Hübner et al. |
| 6,784,677 B1 * | 8/2004 | Miller et al. ................ 324/754 |
| 2003/0212523 A1 | 11/2003 | Dorough et al. |
| 2004/0158783 A1 | 8/2004 | Sun et al. |

\* cited by examiner

*Primary Examiner*—Vinh P. Nguyen
(74) *Attorney, Agent, or Firm*—Edell, Shapiro & Finnan, LLC

(57) ABSTRACT

A technique to simplify the cost and complexity of performing a full wafer test or probe of semiconductor wafers. A probe card connection layer is disposed on a surface of the wafer. The probe card connection layer comprises a plurality of probe contact connection points on a top surface of the probe card connection layer and a plurality of conductive traces on a bottom surface of the probe card connection layer. Each conductive trace is electrically connected to a corresponding probe contact connection point and electrically connected to a similar function connection point on each of a plurality of chips. Each conductive trace carries a test signal supplied to a corresponding probe contact connection point to the similar function connection points of the chips to which it is connected. A test signal can be delivered from a probe card device to multiple chips in the wafer nearly simultaneously from one probe card contact, thus greatly reducing the number of contacts required on the probe card and reducing the time required to test each chip on the wafer.

22 Claims, 4 Drawing Sheets

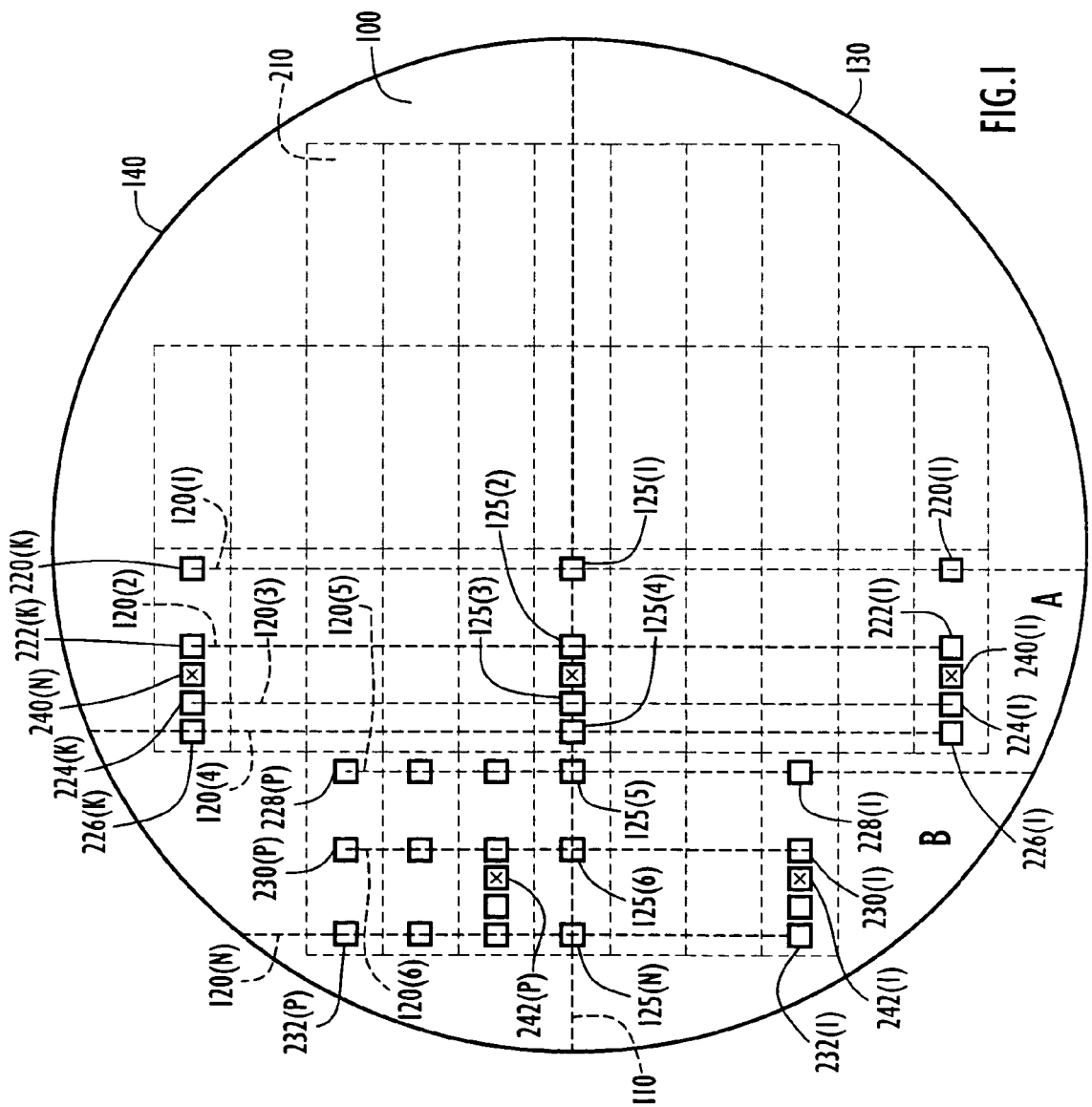

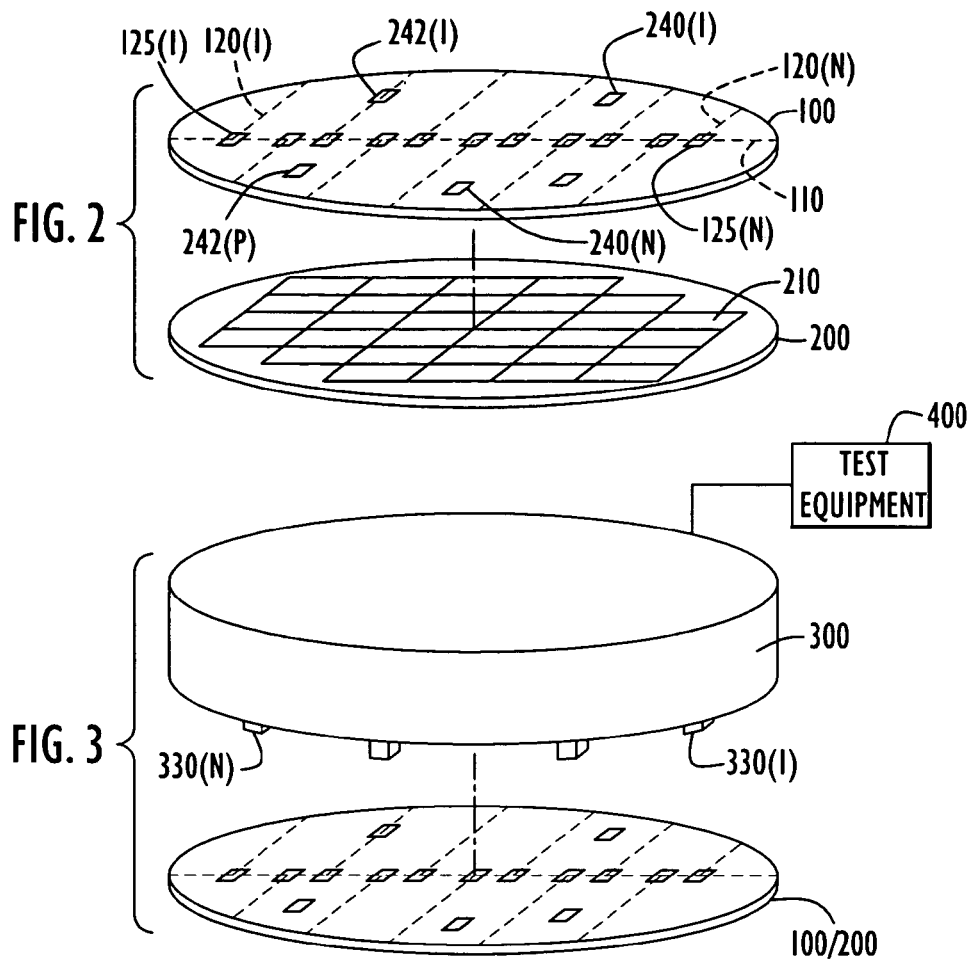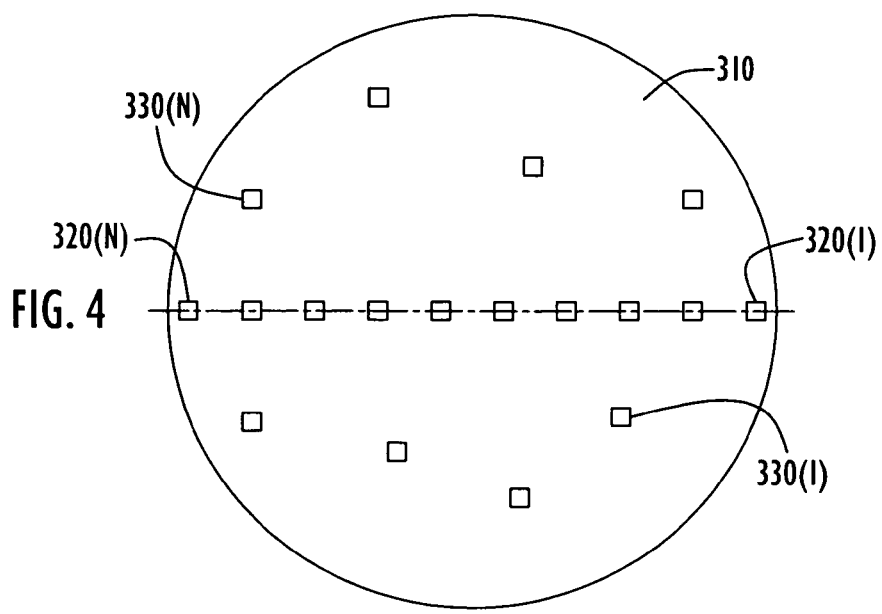

METHOD FOR FULL WAFER CONTACT PROBING, WAFER DESIGN AND PROBE CARD DEVICE WITH REDUCED PROBE CONTACTS

FIELD OF THE INVENTION

This invention relates to testing semiconductor wafers, and more particularly to full wafer contact probing.

BACKGROUND OF THE INVENTION

Semiconductor integrated circuits (IC) are manufactured using complex and time consuming processes to fabricate a wafer having large numbers of individual IC "chips". Before the wafer is cut in order to test and package each of the chips, itself a laborious task, it is desirable to perform tests on the wafer as a whole. These tests are referred to as "full wafer" tests or probes.

A full wafer test is performed by aligning a probe card device having contacts that are positioned and aligned to make contact with corresponding bond pads on the wafer. Then, the probe card device supplies test signals through appropriate ones of the contacts to the bond pads on the wafer.

With increasing miniaturization of the chips on a wafer, more chips are formed on a single wafer, and the probe card to test these wafers must have more probe contacts in order to achieve full wafer contact. This results in a significant increase in the cost and complexity of probe cards. For example, if a wafer has 750 chips on it and each chip has 45 contact points, approximately 33,750 probe contacts would be required in order to establish full wafer contact. This presents a space problem on the probe card and increases the resulting force required for application to the wafer in order to achieve sufficient electrical contact at all of the probe contacts.

Solutions to this problem heretofore known involve providing more contact points on the probe card device or using multiple "touch downs" of the probe card device to the wafer. There is, therefore, room for improving the cost and time duration of the full wafer probe process.

SUMMARY OF THE INVENTION

Briefly, a technique is provided to simplify the cost and complexity of performing a full wafer test or probe of semiconductor wafers. The wafer has a plurality of integrated circuit (IC) chips or die formed therein, as is known in the art. A probe card connection layer is disposed on a surface of the wafer. The probe card connection layer comprises a plurality of probe contact connection points on a top surface of the probe card connection layer and a plurality of conductive traces on a bottom surface of the probe card connection layer. Each conductive trace is electrically connected to a corresponding probe contact connection point and electrically connected to a similar function connection point on each of a plurality of chips. Each conductive trace carries a test signal supplied to a corresponding probe contact connection point to the similar function connection points of the chips to which it is connected. Consequently, a test signal can be delivered from a probe card device to multiple chips in the wafer nearly simultaneously from one probe card contact, thus greatly reducing the number of contacts required on the probe card and reducing the time required to test each chip on the wafer.

The objects and advantages of the invention will become more readily apparent when reference is made to the following description taken in conjunction with the accompanied drawings, wherein like reference numerals in the various figures are utilized to designate like components.

BRIEF DESCRIPTION OF THE DRAWINGS

FIG. 1 is a view of a surface of a semiconductor wafer having a probe card connection layer.

FIG. 2 is a side perspective disassembled view of a semiconductor wafer and a probe card connection layer.

FIG. 3 is a side perspective view of a probe card device being positioned on the probe card connection layer of a semiconductor wafer.

FIG. 4 is a view of the active surface of the probe card device showing the orientation of its contact pins.

DETAILED DESCRIPTION

Figure 6:
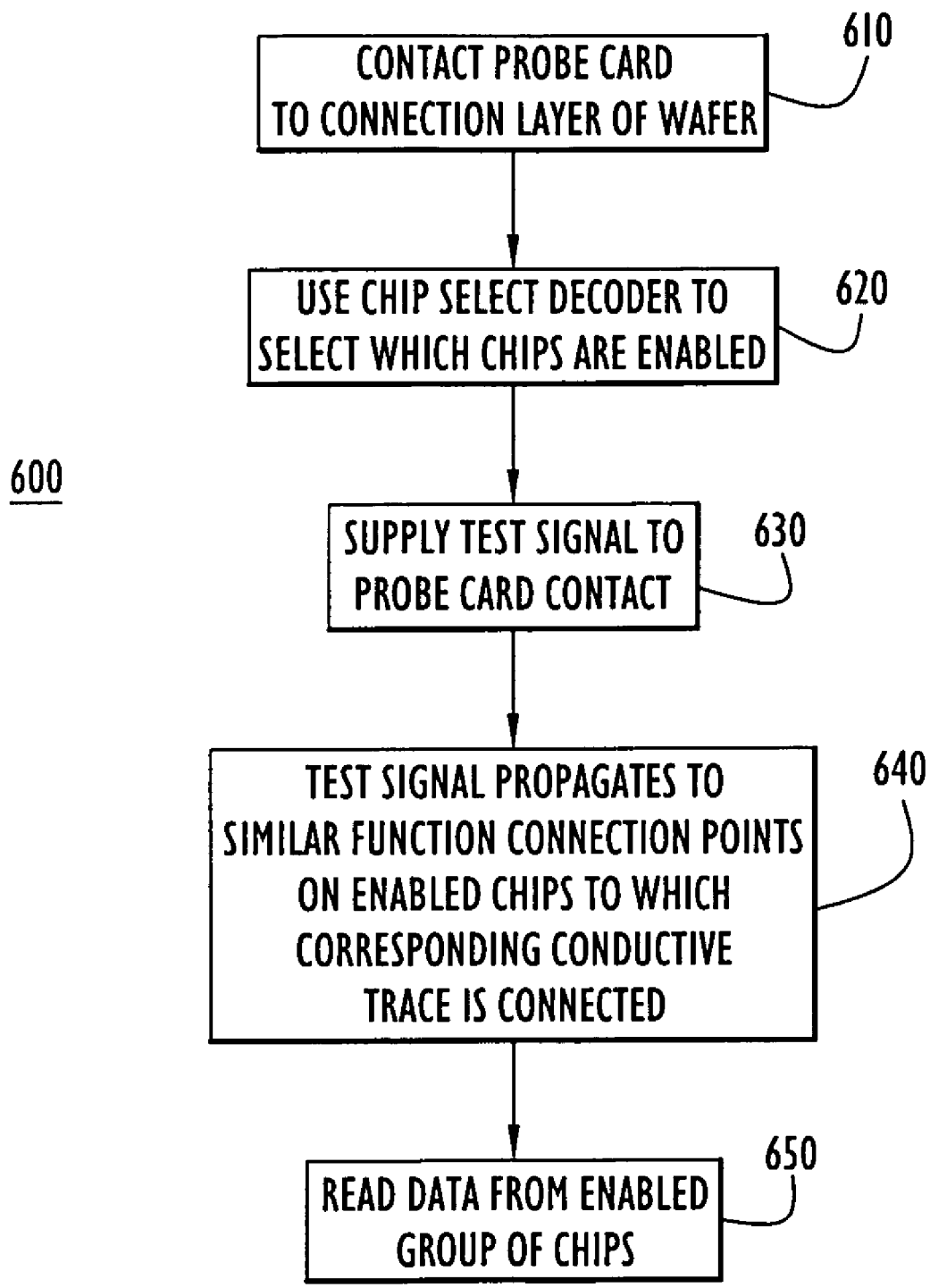
FIG. 6 is a flow chart showing how a probe card is used with a wafer having the probe card connection layer.

Referring first to FIGS. 1 and 2, a semiconductor wafer 200 is shown having a probe card connection layer 100 deposited thereon. The wafer 200 comprises a plurality of integrated circuit (IC) chips 210 formed therein. The chips formed in the wafer 200 are also referred to as die. The connection layer 100 is formed on the wafer after the normal wafer fabrication process is completed, and comprises a plurality of conductive traces 120(1) to 120(N) that extend outward from corresponding ones of a plurality probe contact connection points (bond pads) 125(1) to 125(N) that are positioned substantially along a diameter 110 of the connection layer 100. Only several of the conductive traces 120(i) and probe contact connection points 125(1) to 125(N) are shown in FIG. 1 for clarity. It should be understood that the conductive traces 120(1) to 120(N) are exposed for electrical contact on a bottom surface of the connection layer 100 where it overlies the chips on the wafer 200. The connection points 125(1) to 125(N) are exposed on the top surface of the connection layer 100 but are electrically connected to a corresponding conductive trace in the connection layer 100. For purposes of explanation only, FIG. 1 illustrates the connection layer 100 as if it were transparent in some areas in order to show how the conductive traces make contact with the chips as described hereinafter.

Each conductive trace 120(1) to 120(N) electrically connects to a similar function connection point on each of a plurality of the chips 210. For example, conductive trace 120(1) connects to similar function connection points (bond pads) 220(1) to 220(N) on chips 210 in column A. Connection points 220(1) to 220(K) are "similar function" connection points on chips 210 in column A in that each connection point has the same function to their chip 210 and therefore can be probed or tested with the same signal. There are K rows of chips in column A. Similarly, conductive trace 120(2) connects to similar function connection points 222(1) to 222(K) on chips 210 in column A; conductive trace 120(3) connects to similar function connection points 224(1) to 224(K) on chips in column A; conductive trace 120(4)

connects to similar function connection points 226(1) to 226(K) on chips in column A; conductive trace 120(5) connects to similar function connection points 228(1) to 228(P) on chips in column B; conductive trace 120(6) connects to similar function connection points 230(1) to 230(P) on chips in column B and conductive trace 120(N) connects to similar function connection points 232(1) to 232(P) on chips in column B. There are P rows of chips in column B. The same is repeated in other columns of the chips on the wafer. An example of the chip functions that can be tested simultaneously are address, command and power supply functions. Thus, the probe card connection layer 100 serves as a connecting layer means on a surface of the wafer for carrying a test signal supplied to similar function connection points on a plurality of chips in the wafer.

The row/column orientation of the chips 210 and the corresponding orientation of the conductive traces 120(1) to 120(N) shown in FIG. 1 is only an example. The chips could be oriented in any pattern and the conductive traces 120(1) to 120(N) would be oriented in a similar pattern on the connection layer 100 to align with the corresponding similar function connection points on the chips. In general, if the probe contact connection points 125(1) to 125(N) are linearly arranged on the probe card connection layer 100, then the conductive traces extend (in one or both directions) from corresponding ones of the probe contact connection points.

Some functions, such as input/output (I/O) of the chips, cannot be tested or probed simultaneously with the same signal. Probe contact connection points (bond pads) 240(1) to 240(N) and 242(1) to 242(P) (marked with an "x") are examples of probe contact connection points that are contacted directly and individually by contacts on a probe card.

There may also be a $V_{DD}$ conductive trace 130 and a $V_{SS}$ conductive trace 140 along the peripheral edge of the connection layer 100 beyond the bond pad rows. These further conductive traces are referred to as "half-ring" conductive traces because they each extend along half of the perimeter of the connection layer 100. Due to the high current demand during full wafer probing, the conductive traces 130 and 140 are contacted by additional $V_{DD}$ or $V_{SS}$ voltage sources/clamps, respectively.

A method for fabricating a semiconductor wafer having the features shown in FIG. 1 may comprise: forming a plurality of integrated circuit chips in layers in a wafer; and forming a probe card connection layer on a surface of the wafer that has a plurality of probe contact connection points and a plurality of conductive traces each of which is electrically connected to a corresponding probe contact connection point and electrically connected to a similar function connection point on each of a plurality of chips.

Turning to FIGS. 3 and 4, a probe card device 300 is shown that is contacted to the connection layer 100 on wafer 200. The probe card device 300 has a plurality of probe contacts oriented on a surface thereof to align with the probe contact connection points on the probe card connection layer, wherein the probe card device supplies the test signal to a probe contact connection point via a probe contact. As an example, for the orientation of the probe card connection points of the connection layer 100 shown in FIG. 1, the orientation of the probe contacts is shown in FIG. 4. There is a plurality of probe contacts 320(1) to 320(N) positioned along a diameter of the contacting surface 310 of the probe card 300, and a plurality of probe contacts 330(1) to 330(N) at various other positions corresponding to the bond pads on the wafer that must be contacted individually. Specifically, the probe contacts 320(1) to 320(N) make contact with corresponding ones of the probe contact connection points 125(1) to 125(N) on the connection layer 100. The probe contacts 330(1) to 330(N) make electrical contact with the probe contact connection points 240(1) to 240(N) and 242(1) to 242(N) for those chip functions that must be tested or accessed individually. A test equipment apparatus 400 is connected to the probe card 300 to supply test signals thereto and to receive read signals that the probe card reads from the wafer.

To summarize, the probe card device 300 comprises a plurality of contact pins oriented on a surface thereof to align with corresponding probe contact connection points on a probe card connection layer on a surface of the semiconductor wafer, wherein the probe card device supplies a test signal to a probe contact that is intended to be supplied to a similar function connection point on each of a plurality of chips on the wafer.

The configuration represented by FIGS. 1–4 makes several tens of thousands of probe contact points redundant and unnecessary, and therefore greatly reduces the complexity and cost of a probe card. In addition, this configuration achieves a faster testing time and greater flexibility for hardware characterization on various test systems. For example, a probe card with approximately 2000 probe contacts is required in the example above of 750 chips per wafer, and 45 contact points per chip, as opposed to a probe card with 33,750 contact points. In general, these techniques reduce the number of contact points from several tens of thousands to a few thousand, i.e., a reduction factor of approximately 10.

Figure 5:
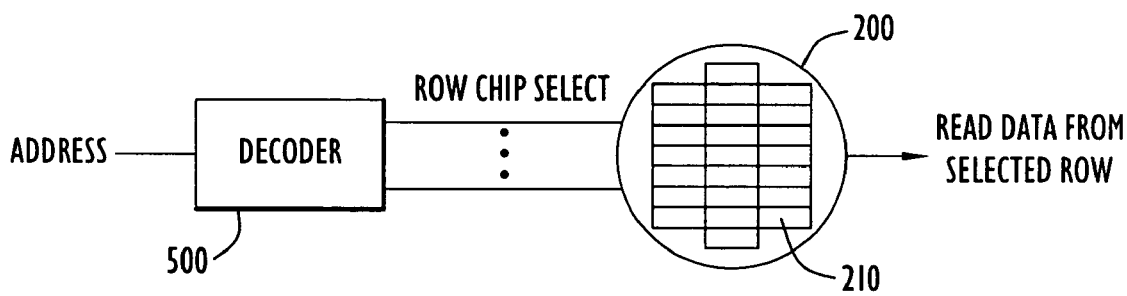
FIG. 5 is a block diagram showing how integrated circuit chips on the wafer are selectively enabled.

Turning to FIG. 5, a configuration is shown wherein a group of chips on the wafer can be selectively enabled for testing/probing purposes. A decoder 500 receives an address (es) for one or a group of chips on the wafer 200 and generates a chip select signal that is coupled to the corresponding chip or group of chips. For example, the decoder 500 generates a signal that selects a row of chips (for a chip arrangement such as the one shown in FIG. 1). Once a chip is enabled, a test signal may be coupled to one of its contact points to test a corresponding function of the chip, and if necessary, retrieve read data from an I/O bond pad of the chip in response to the test signal.

Turning to FIG. 6, with continued reference to FIGS. 1–4, a process 600 is described that explains how the connection layer arrangement works. In step 610, the probe card 300, is contacted to the connection layer 100 of the wafer 200. In so doing, the probe contacts make electrical connections with the corresponding probe contact connection points on the connection layer 100. In step 620, chip selection may be performed to select which chips are enabled, such as which row of chips is enabled. Next, in step 630, the test equipment apparatus 300 generates a test signal which is coupled to the probe card contact, from which it is conducted to the corresponding probe contact connection point on the connection layer 100. If the test signal is one that can be delivered to multiple chips, then in step 630, the test signal is delivered to one of the probe contacts 320(1) to 320(N), and in step 640 the test signal propagates from the probe contact connection point on the connection layer via the corresponding conductive trace to each of the similar function connection points on the chips to which that conductive trace is connected. Only those chips that are enabled will respond to the test signal. In step 650, read data of the enabled chips may be collected by a conductive trace and coupled back to the probe card and to the test equipment apparatus. As known in the art, a wafer probe testing procedure tests for unwanted electrically open or shorted circuits, among other characteristics.

Thus, to summarize, a method is provided for testing a semiconductor wafer comprising: a. positioning a probe card device on a semiconductor wafer to make electrical connection between probe contacts and corresponding probe card connection points on the wafer; supplying a test signal to a probe card contact; and distributing the test signal to a similar function connection point on each of a plurality of integrated circuit chips formed in the wafer. Distributing may involve connecting the test signal from the probe card connection points on the probe card connection layer to the similar function connection points via a conductive trace formed in the probe card connection layer that makes electrical connection to the similar function connection points in each of the plurality of chips.

Figure 7:
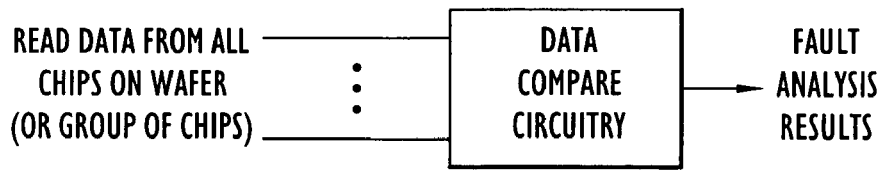
FIG. 7 is a block diagram of a data compare circuit that processes data read from a plurality of chips on the wafer.

FIG. 7 illustrates a configuration where data read from multiple chips by a probe card may be analyzed to determine whether there is a fault in the wafer. A data compare circuit 700 is provided that receives as input read data from all or a subset of chips on the wafer that was generated in response to a particular test function. The data compare circuit 700 processes signals read from similar function connection points on a plurality of chips in the wafer to determine whether there is a fault in the wafer, and if so, generally where those faults may occur (e.g., in which chip or group of chips). The read data from the chips may be collected from the individual I/O bond pads of the enabled chips on the wafer by corresponding probe contacts on the probe card. The data compare circuit 700 may reside in the test equipment apparatus, on the wafer, or in each chip on the wafer.

Figure 8:
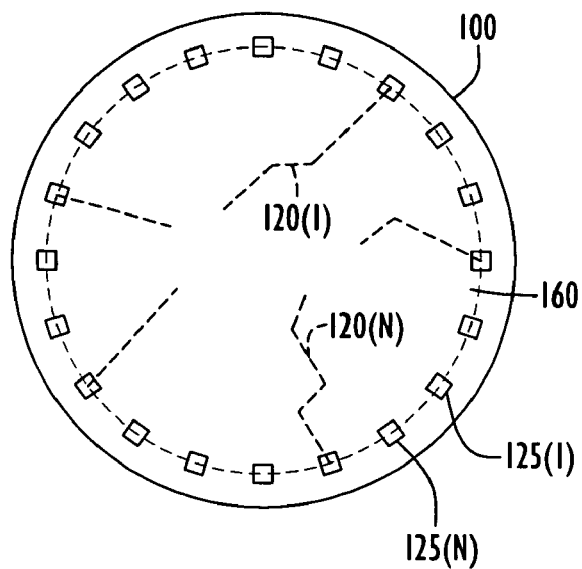
FIG. 8 is a view of a probe card connection layer showing that the conductive surfaces thereon may take on a variety of orientations.

FIG. 8 illustrates another orientation for a connection layer 100. In this orientation, the probe card connection points 125(1) to 125(N) are arranged in a circular pattern on the connection layer 100 and the conductive traces 120(1) to 120(N) extend (inward) from the connection points to make contact with similar function connection points on groups of chips. While FIG. 8 shows that the probe card connection points 125(1) to 125(N) are disposed along a peripheral edge of the probe card connection layer 100, it should be understood that they may be disposed more towards the center of the probe card connection layer 100, and the conductive traces 120(1) to 120(N) extend inward and outward from the probe card connection points.

The conductive traces 120(1) to 120(N) will follow whatever the orientation is of the chips formed in the wafer so as to align and make contact with the similar function connection points on groups of chips. In some cases, this means that a conductive trace extends in a straight line from a probe card connection point, and in other cases, in conductive trace may deviate from a straight line path as necessary to make contact with the similar function connection points on certain chips. Numerous other configurations are possible without departing from the scope and spirit of the concepts described herein.

It should be understood that the connection layer 100 may be etched away after a wafer is tested, either prior to dicing and packaging, or after dicing. Alternatively, the connection layer 100 may remain, and furthermore, may be used for conductive paths that form a functional part of the chips in the wafer.

One semiconductor manufacturing application where this technique has significant utility is in the testing of dynamic random access memory (DRAM) chips. These techniques allows for testing of DRAM chips in a time range unmatched by systems that are limited to the number of DC units and tester channels. However, this wafer contact probing technique may be useful in any semiconductor manufacturing application where full wafer probing is desired.

The full wafer probe techniques described herein may also be used for full wafer burn-in, chip functional testing, etc. These techniques have particular advantages for a wafer-level burn-in. Reliability or "burn-in" testing involves powering up the chips on the wafer for an extended period of time, or exercising some or all of the circuitry on the chips. To accelerate the burn-in process, it may be conducted at elevated temperature. Burn-in is beneficial in applications where tolerance to chip failure is very low, e.g., medical devices, multi-chip modules, and the like.

Wafer-level burn-in testing using the techniques described herein is much faster, and involves less risk of damage to the wafer. Powering up multiple chips at a time may be achieved as described above. In addition, because fewer probe contacts are required to make full-wafer contact, less force is imposed on the wafer by the probe card thus reducing the risk of damaging the wafer.

To summarize again, among other independent concepts described herein, a semiconductor wafer is provided that comprises: a plurality of integrated circuit chips formed in the wafer; and a probe card connection layer on a surface of the wafer that comprises a plurality of probe contact connection points on a top surface of the probe card connection layer and a plurality of conductive traces on a bottom surface of the probe card connection layer, each conductive trace being electrically connected to a corresponding probe contact connection point and electrically connected to a similar function connection point on each of a plurality of chips, wherein each conductive trace carries a test signal supplied to a corresponding probe contact connection point to the similar function connection points of the chips to which it is connected.

The system and methods described herein may be embodied in other specific forms without departing from the spirit or essential characteristics thereof. The foregoing embodiments are therefore to be considered in all respects illustrative and not meant to be limiting.

What is claimed is:

1. A semiconductor wafer comprising:
    a. a plurality of integrated circuit chips formed in the wafer; and
    b. a probe card connection layer on a surface of the wafer overlying integrated circuit chips formed in the wafer and comprising a top surface, a bottom surface, a plurality of probe contact connection points that are exposed for electrical contact on the top surface of the connection layer and a plurality of conductive traces that are exposed for electrical contact on the bottom surface of the connection layer and overlying the integrated circuit chips, each conductive trace being electrically connected to a corresponding probe contact connection point and electrically connected to a similar function connection point on each of a plurality of chips, wherein a conductive trace distributes a test signal supplied to a corresponding probe contact connection point to the similar function connection points on each of a plurality of the chips to which it is connected.

2. The semiconductor wafer of claim 1, wherein the probe contact connection points on the connection layer are linearly arranged on the probe card connection layer and the conductive traces extend from the probe contact connection points.

3. The semiconductor wafer of claim 2, wherein the probe contact connection points on the connection layer are positioned along a diameter of the probe card connection layer and the conductive traces extend from the probe contact connection points.

4. The semiconductor wafer of claim 3, wherein the plurality of chips are arranged in columns that are generally perpendicular to the diameter of the probe card connection layer, and wherein the conductive traces extend along a column of chips to electrically connect to the similar function connection points on each chip in a column.

5. The semiconductor wafer of claim 1, and further comprising a further conductive trace disposed on the probe card connection layer that is connected to select conductive traces to supply a voltage source or voltage clamp to the select conductive traces.

6. The semiconductor wafer of claim 5, and wherein the further conductive trace is disposed proximate a periphery of the probe card connection layer in a half-ring orientation.

7. The semiconductor wafer of claim 1, wherein the probe contact connection points are disposed in a circular pattern on the probe card connection layer and the plurality of conductive traces extend from the probe contact connection points to make electrical connection with the similar function connection points on corresponding pluralities of chips.

8. The semiconductor wafer of claim 1, and further comprising one or more probe contact connection points disposed on the probe card connection layer that are not connected to a conductive trace and are to be individually contacted by contacts on a probe card.

9. The semiconductor wafer of claim 1, wherein the probe card connection layer is etched away after the semiconductor wafer is tested.

10. A combination comprising the semiconductor wafer of claim 1, and comprising a probe card device having a plurality of probe contacts oriented on a surface thereof to align with the probe contact connection points on the probe card connection layer, wherein the probe card device supplies the test signal to a probe contact connection point via a probe contact.

11. The combination of claim 10, and further comprising a decoder having a plurality of outputs each of which is connected to a chip select contact on a group of a chips in the semiconductor wafer, wherein the decoder outputs a chip select signal in response to an address signal to enable a corresponding group of chips in the semiconductor wafer that are to respond to the test signal supplied by the probe card device.

12. A method for fabricating a semiconductor wafer comprising:
a. forming a plurality of integrated circuit chips in a wafer; and
b. forming a probe card connection layer on a surface of the wafer overlying the integrated circuit chips, and that has a plurality of probe contact connection points on a top surface and a plurality of conductive traces on a bottom surface of the connection layer and overlying the integrated circuit chips, each of the conductive traces being electrically connected to a corresponding probe contact connection point and electrically connected to a similar function connection point on each of a plurality of chips.

13. The method of claim 12, wherein forming the probe card connection layer comprises forming the probe card connection points to be arranged linearly on the probe card connection layer and forming the conductive traces to extend from the probe card connection points.

14. The method of claim 13, wherein forming the probe card connection layer comprises forming the probe contact connection points along a diameter of the probe card connection layer.

15. The method of claim 13, wherein forming the probe card connection layer further comprises forming the probe card connection points in a circular pattern on the probe card connection layer and the plurality of conductive traces extend from the probe card connection points.

16. A method for testing a semiconductor wafer comprising:
a. positioning a probe card device on a probe card connection layer formed on a surface of a semiconductor wafer and supporting probe card connection points to make electrical connection between probe contacts from said probe card device and corresponding probe card connection points on the wafer;
b. supplying a test signal to a probe card contact; and
c. distributing the test signal to a similar function connection point on each of a plurality of integrated circuit chips formed in the wafer.

17. The method of claim 16, wherein distributing comprises connecting the test signal from the probe card connection points on the probe card connection layer to the similar function connection points via a conductive trace formed in the probe card connection layer that makes electrical connection to the similar function connection points in each of the plurality of chips.

18. The method of claim 16, wherein supplying comprises supplying a burn-in test signal to the probe card contact.

19. The method of claim 16, and further comprising processing signals read from similar function connection points on a plurality of chips in the wafer to determine whether there is a fault in the wafer.

20. The method of claim 16, and further comprising etching away the probe card connection layer after testing of the wafer.

21. A semiconductor wafer comprising:
a. a plurality of integrated circuit chips formed in the wafer; and
b. a probe card connection layer on a surface of the wafer, the connection layer overlaying integrated circuit chips formed in the wafer and comprising a top surface, a bottom surface a plurality of probe contact connection points on the top surface of the probe card connection layer and a plurality of conductive traces on the bottom surface of the probe card connection layer and overlying the integrated circuit chips, each conductive trace being electrically connected to a corresponding probe contact connection point and electrically connected to a similar function connection point on each of a plurality of chips, wherein each conductive trace distributes a test signal supplied to a corresponding probe contact connection point to the similar function connection points on each of a plurality of the chips to which it is connected.

22. The semiconductor wafer of claim 21, wherein the probe card connection layer is etched away after the semiconductor wafer is tested.

* * * * *